US007419547B2

(12) United States Patent
Mey

(10) Patent No.: US 7,419,547 B2
(45) Date of Patent: Sep. 2, 2008

(54) METHOD FOR MARKING A CRYSTALLINE MATERIAL USING CATHODOLUMINESCENCE

(75) Inventor: Jacob Louis Mey, New York, NY (US)

(73) Assignee: American Museum of Natural History, New York, NY (US)

( * ) Notice: Subject to any disclaimer, the term of this patent is extended or adjusted under 35 U.S.C. 154(b) by 0 days.

(21) Appl. No.: 11/494,670

(22) Filed: Jul. 26, 2006

(65) Prior Publication Data

US 2008/0022925 A1 Jan. 31, 2008

(51) Int. Cl.
*C30B 35/00* (2006.01)
(52) U.S. Cl. .............................. 117/200; 117/2; 117/3; 117/4
(58) Field of Classification Search ............... 117/2, 117/3, 4, 200
See application file for complete search history.

(56) References Cited

OTHER PUBLICATIONS

Characterization of ZrO2: Mn, Cl luminescent coatings synthesized by the Pyrosol technique, Garcia-Hipolita, M., et al, Optical Materials, (Sep. 2002), vol. 20, No. 2, pp. 113-118.*
Cathodoluminescence study of SnO2 powders aimed for gas sensor applications, Korotcenkov, G., et al, Material Science & Engineering B (Solid-State Materials for Advanced Technology), (Jun. 15, 2006), vol. 130, No. 1-3, pp. 200-205.*

* cited by examiner

*Primary Examiner*—Felisa C Hiteshew
(74) *Attorney, Agent, or Firm*—Davidson, Davidson & Kappel, LLC

(57) ABSTRACT

In a first exemplary embodiment of the present invention, a method is provided for marking a sample of a doped crystalline material. According to a feature of the present invention, the method comprises the steps of causing a controlled alteration to the crystalline material at a preselected spot on the sample of the crystalline material, sufficient to cause a change in a cathodoluminescence spectrum of the crystalline material at the preselected spot and utilizing the altered cathodoluminescence spectrum to mark the crystalline material.

12 Claims, 11 Drawing Sheets

3c. The positive residual CL signal caused by beam alteration in the rim.

METHOD FOR MARKING A CRYSTALLINE MATERIAL USING CATHODOLUMINESCENCE

BACKGROUND OF THE INVENTION

Diamonds and other gemstones are often marked for purposes of identification, security and tracking. Unique marks, symbols, logos or bar codes are often used to provide a particular gemstone, such as, for example, a diamond, with a unique characteristic, so that the marked stone can be identified and distinguished from other gemstones. Many techniques, such as laser etching and ion beam marking, have been proposed for imprinting the unique indicia on the gemstone.

Typically, the mark can be seen using a jeweler's loop or an ordinary microscope. A problem with known marking techniques is that the marks produced can be seen and altered by unauthorized persons, and thus, rendered unusable as a unique identifying mark. Accordingly, there is a need for a marking method that imprints a unique identifying mark that is difficult to detect and alter.

SUMMARY OF THE INVENTION

The present invention provides a method for marking a crystalline material using cathodoluminescence.

In a first exemplary embodiment of the present invention, a method is provided for marking a sample of a doped crystalline material. According to a feature of the present invention, the method comprises the steps of causing a controlled alteration to the crystalline material at a preselected spot on the sample of the crystalline material, sufficient to cause a change in a cathodoluminescence spectrum of the crystalline material at the preselected spot and utilizing the changed cathodoluminescence spectrum to mark the crystalline material.

In a second exemplary embodiment of the present invention, a method is provided for marking and identifying a sample of a doped crystalline material. According to a feature of the present invention, the method comprises the steps of causing controlled alteration to the crystalline material at each of a sequence of preselected spots on the sample of the crystalline material, sufficient to cause a change in a cathodoluminescence spectrum of the crystalline material at each of the preselected spots, and storing information relating to the changed cathodoluminescence spectra at the sequence of the preselected spots. Pursuant to a further feature of the present invention, the stored information is utilized to identify the sample.

DETAILED DESCRIPTION OF THE PREFERRED EMBODIMENTS

Figure 1:
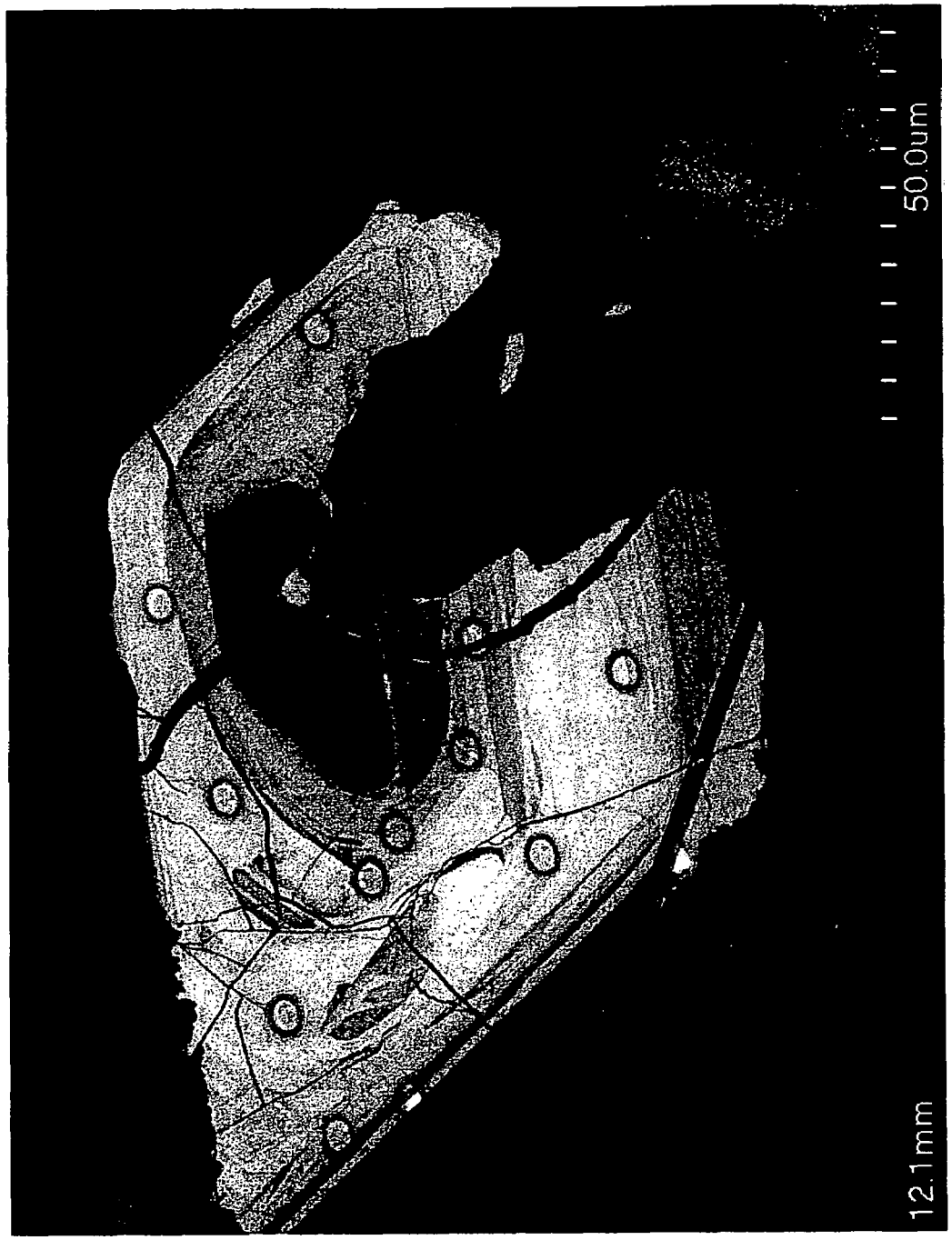
FIG. 1 shows cathodoluminescence in a zircon crystal with altered spots, according to a feature of the present invention.

Referring now to the drawings, and initially to FIG. 1, there is shown a zircon crystal used in an example of the present invention. The sample of FIG. 1 shows cathodoluminescence. The present invention is applicable to any doped crystalline materials that show a cathodoluminescence effect having a spectrum, such as diamonds, rubies, jadeite, and so on. The crystalline material can be doped naturally or by artificially introduced doping. Artificially introduced doping is defined by an introduction to the crystalline material of a trace amount of a substance that alters the cathodoluminescent effect of the crystalline material. By altering characteristics, such as, for example, cathodoluminescence, of either a naturally doped or artificially doped crystalline material on the nanometer or micrometer scale, such alteration can be used to store information and identifying marks in the doped crystalline material.

Cathodoluminescence is illumination within the visible range of the electromagnetic spectrum, that is emitted from a crystal while the crystal is irradiated by, for example, an electron beam from an electron microscope. A cathodoluminescence detector can be attached to the electron microscope for detection and recording of the illumination. Cathodoluminescence can be analyzed in terms of spectral characteristics that can be caused by intrinsic factors such as crystalline lattice strains, and extrinsic factors such as trace amounts of certain elements within the crystal, such as, for example, rare earth elements, either by natural occurrence or introduced to the crystal by artificial doping.

Figure 2:
FIG. 2 shows the crystal of FIG. 1 in a panchromatic image stack.

In the crystal example of FIG. 2, zircon from a kimberlitic type rock from Telemark of central Norway, was analyzed. Preselected spots on the sample were intentionally altered at a microscopic level, by a controlled application of a 20 kV-200 nA micro-probe beam. The electron beam causes alterations to the lattice structure of the crystal, or subtle redistributions of certain elements in the crystal, resulting in a significant change in the spectral characteristics of the cathodoluminescence. The sample of FIG. 2 was imaged using a Hitachi S-4700 cold field emission scanning electron microscope (SEM) equipped with BSE (GW Electronics—Centaurus), EDS (Princeton Gamma Tech (now Bruker)) and high resolution cathodoluminescence detectors (Gatan MonoCL 3). FIG. 2 shows the crystal of FIG. 1 in a panchromatic image stack composed of three band pass images, each acquired with a blue (450-490 nm), green (530-570 nm) and red (630-670 nm) filter.

Highly resolved cathodoluminescence spectra of the zircon sample were collected at several different bandwidths, each spanning 50-100 nm. The resulting spectral images represent bandwidth dependent levels of zircon cathodoluminescence intensity in the detectable spectrum ranging from 400-880 nm. FIGS. 3-5 depict graphs of spectra for cathodoluminescence at various preselected altered spots of the zircon crystal sample of FIG. 2, including unaltered and altered spectra, and as a residual of the unaltered and altered spectra, respectively. The spectra are each taken from a 2×2 micron beam from the Hitachi S-4700 cold field emission scanning electron microscope.

Figure 3A:
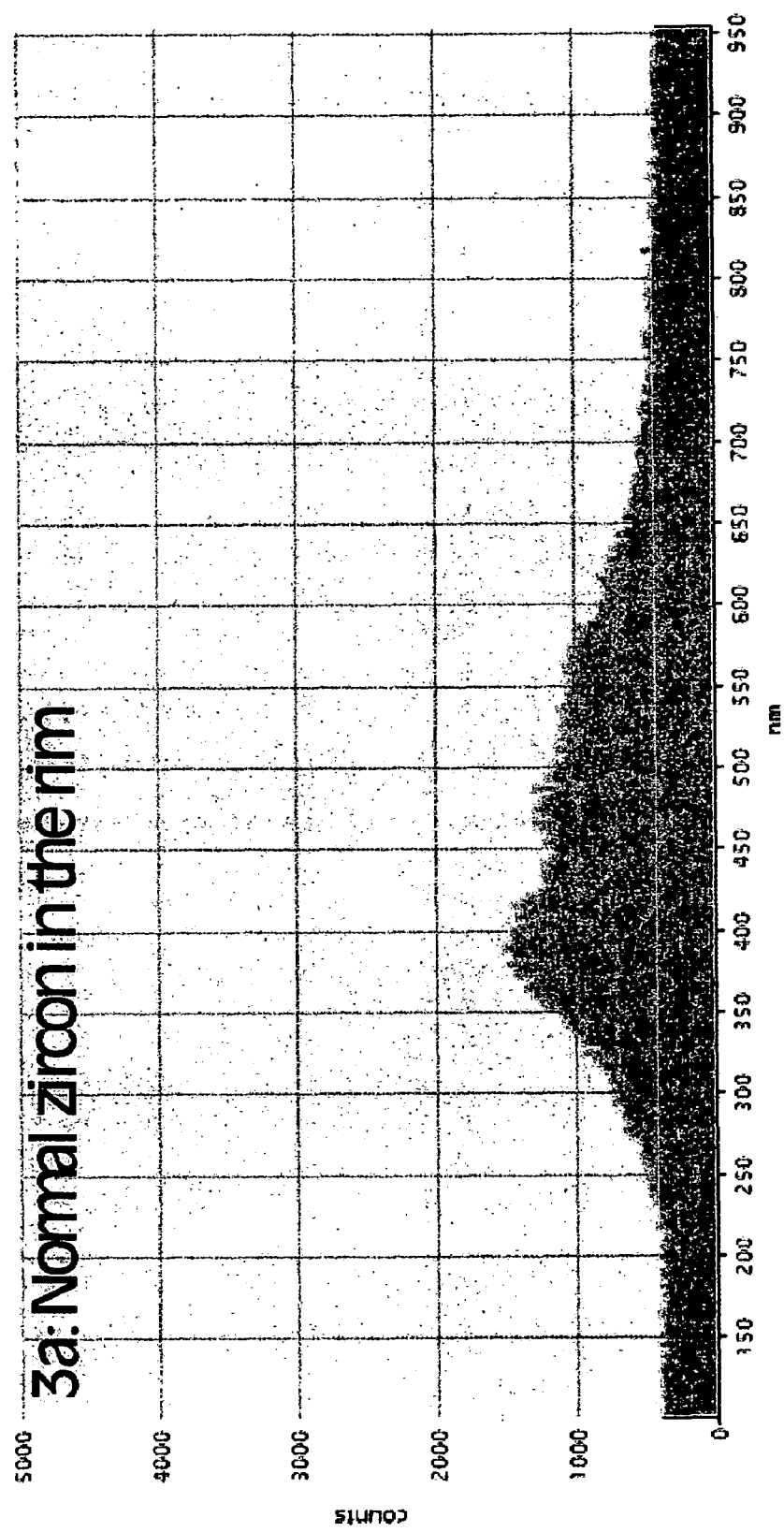
FIGS. 3a-c are graphs of spectra for cathodoluminescence at an altered spot of the zircon crystal, near the rim of the crystal, as shown in FIG. 2, including unaltered and altered spectra, and as a residual of the unaltered and altered spectra, respectively.
Figure 4A:
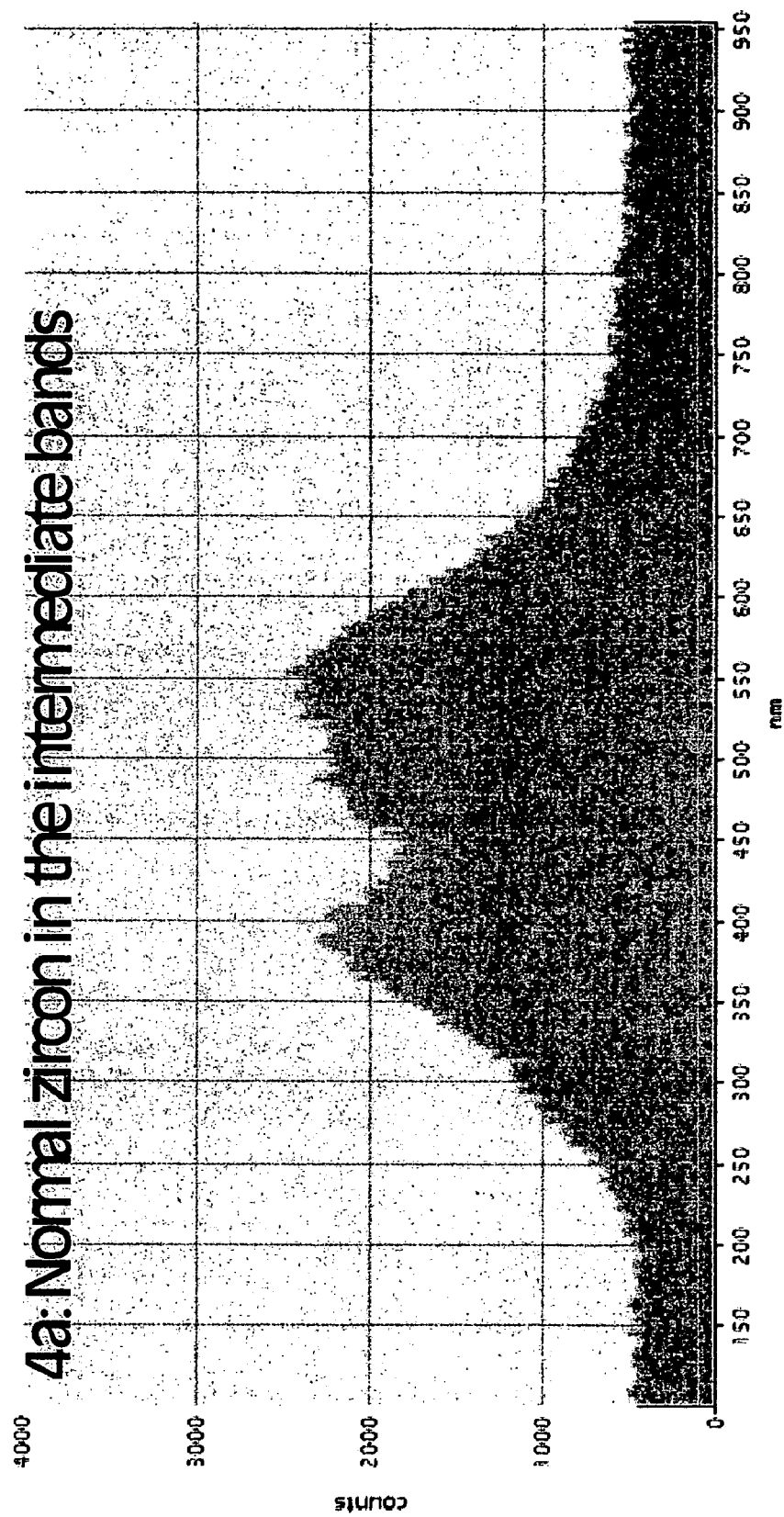
FIGS. 4a-c are graphs of spectra for cathodoluminescence at an altered spot of the zircon crystal, at an intermediate band of the crystal, as shown in FIG. 2, including unaltered and altered spectra, and as a residual of the unaltered and altered spectra, respectively.
Figure 5A:
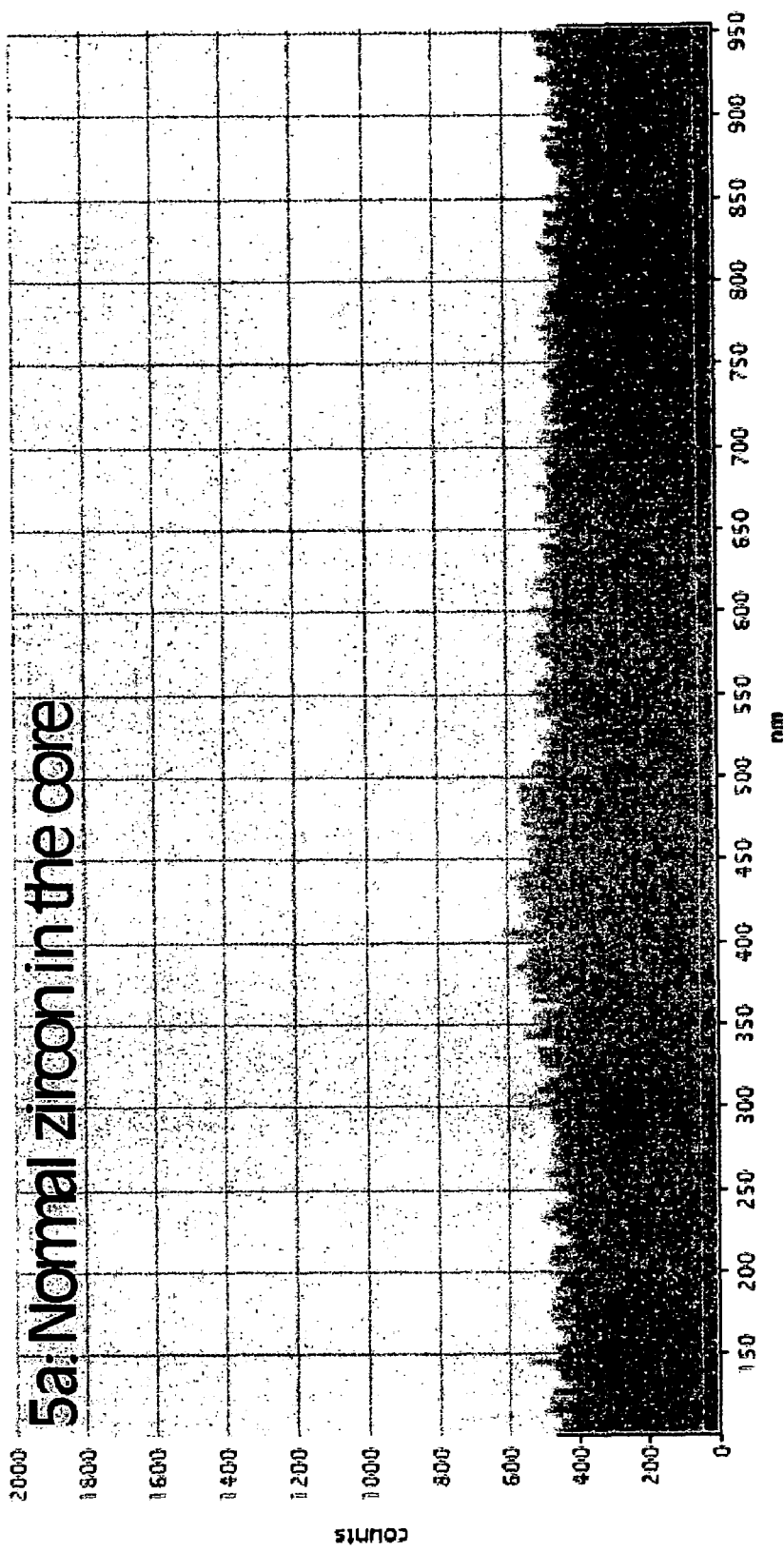
FIGS. 5a-c are graphs of spectra for cathodoluminescence at an altered spot of the zircon crystal, at a core portion of the crystal, as shown in FIG. 2, including unaltered and altered spectra, and as a residual of the unaltered and altered spectra, respectively.

FIGS. 3a, 4a, 5a each depict an unaltered cathodoluminescence spectrum, from an unaltered area of the crystal, each immediately adjacent a respective altered spot, identified by the reference numerals 5, 6, 7, in FIG. 2, respectively.

Figure 3B:
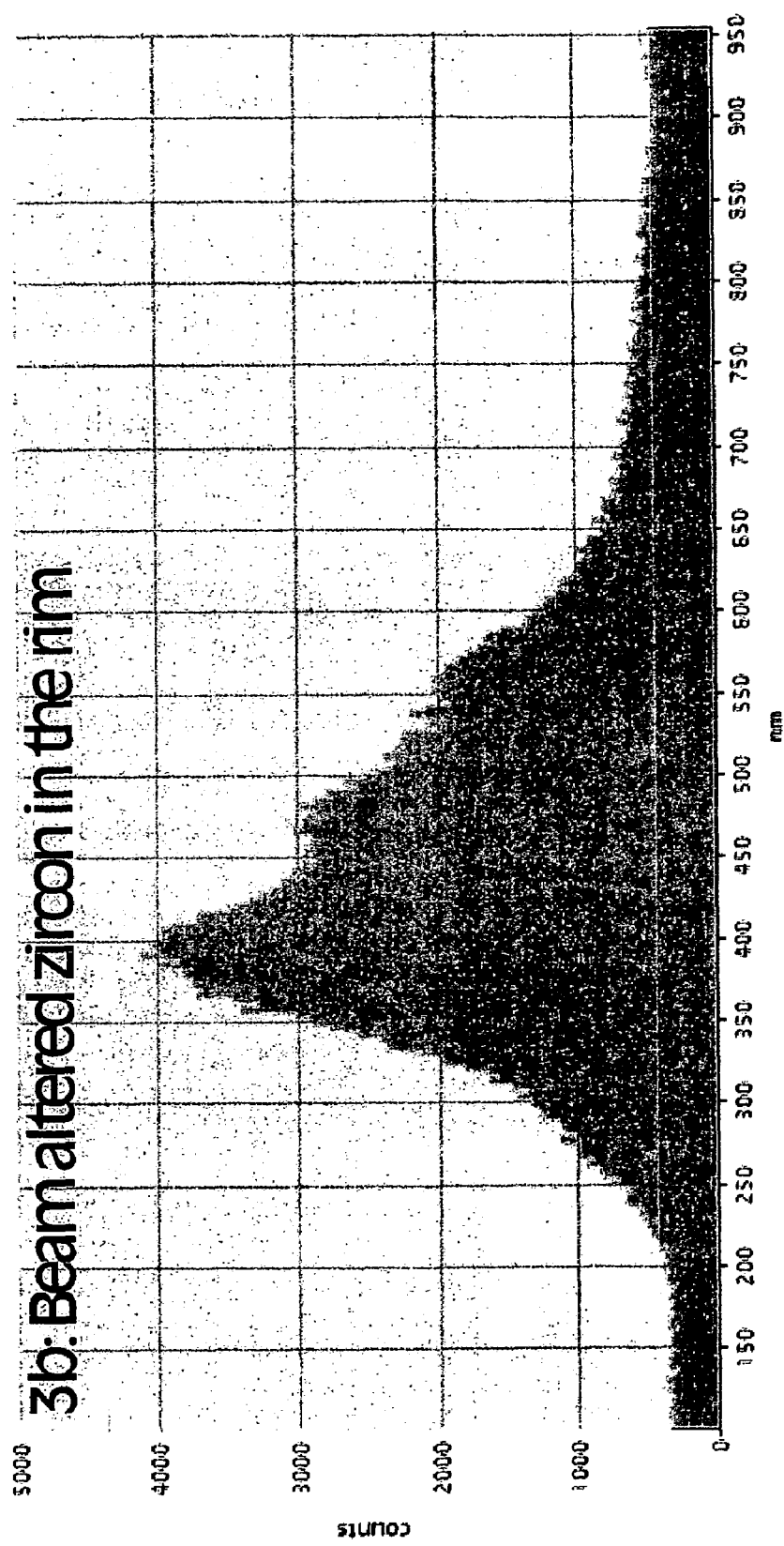

As shown in FIG. 2, the altered spot 5 is at the rim of the crystal. The altered spot 6 is at an intermediate band of the crystal, and the altered spot 7 is at a core portion of the crystal. FIGS. 3b, 4b, 5b each depict a cathodoluminescence spectrum from an altered area of the crystal, the altered spots identified by the reference numerals 5, 6, 7, in FIG. 2, respectively. Finally, FIGS. 3c, 4c, 5c each depict a residual of the unaltered and altered spectra, each obtained by subtracting the corresponding spectrum of the unaltered crystalline structure from the corresponding altered spectrum.

Figure 3C:
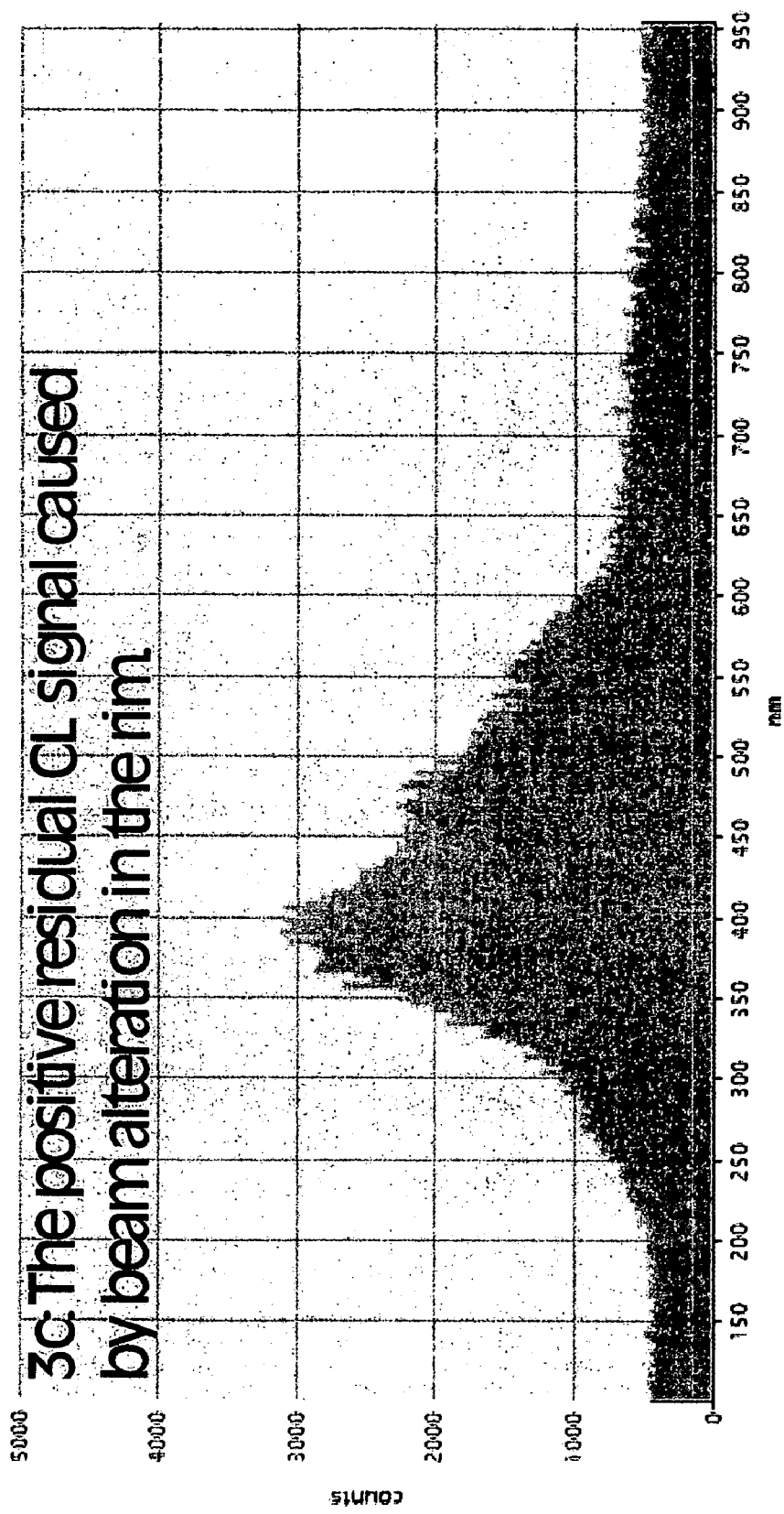
Figure 4B:
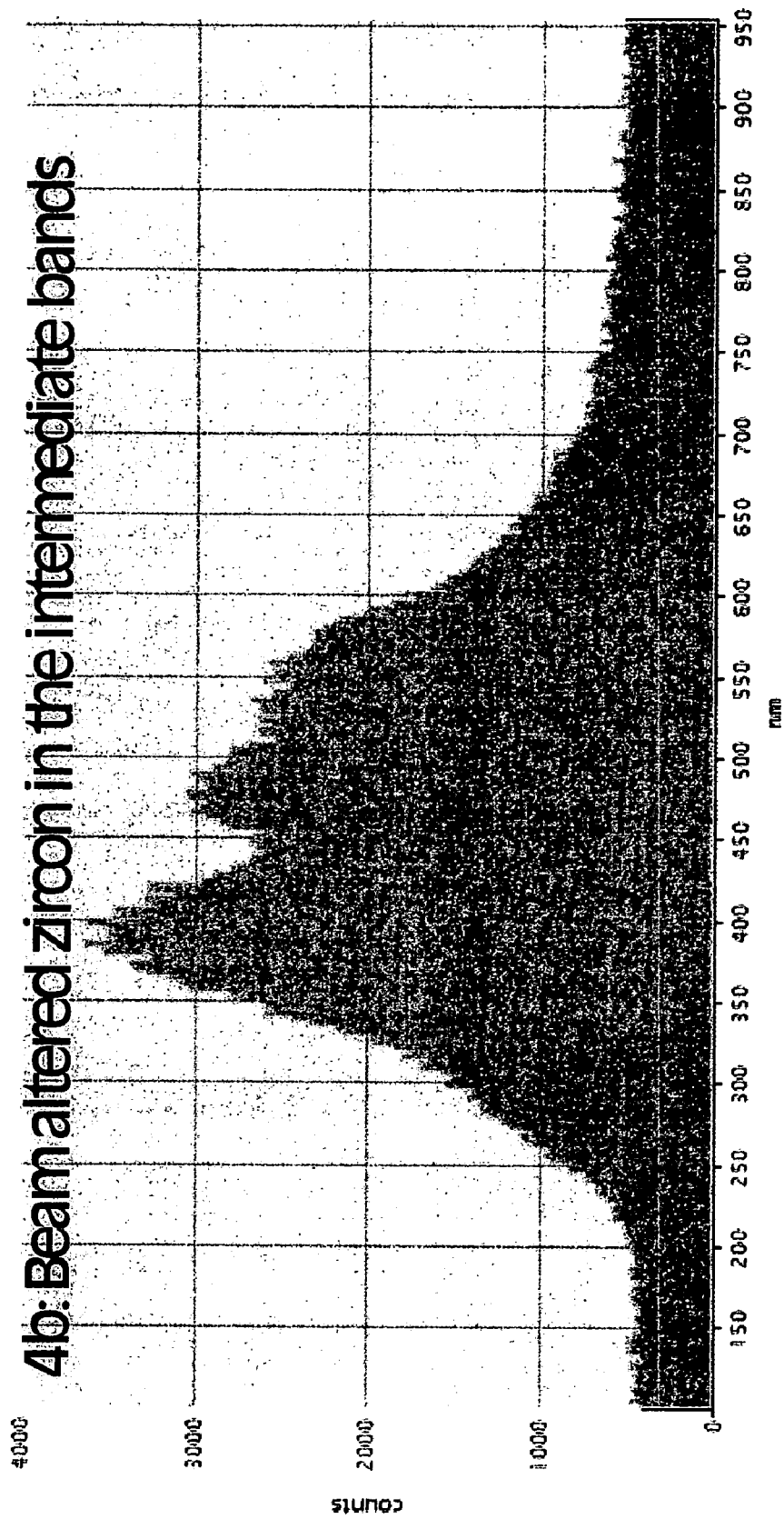
Figure 4C:
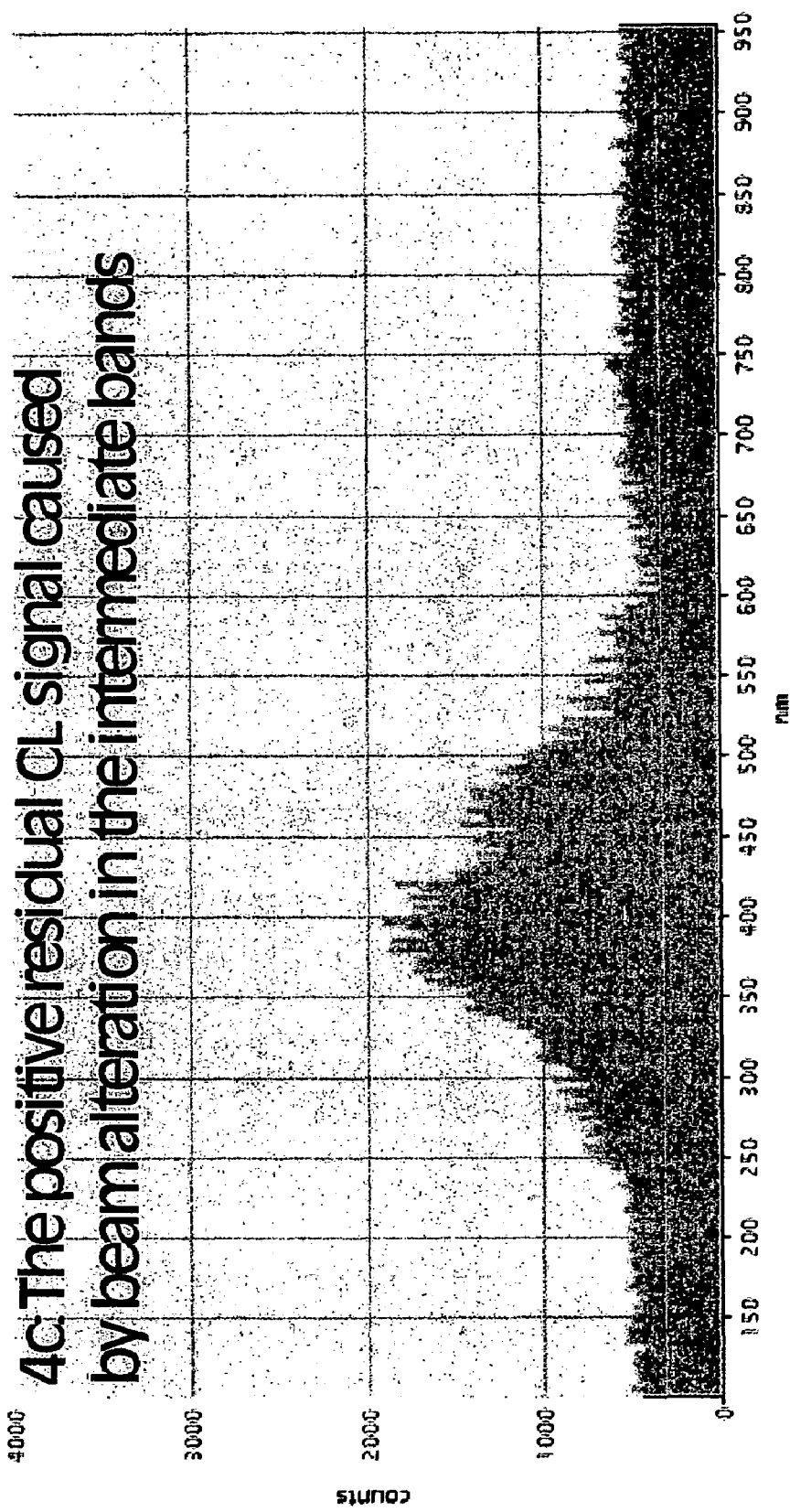
Figure 5B:
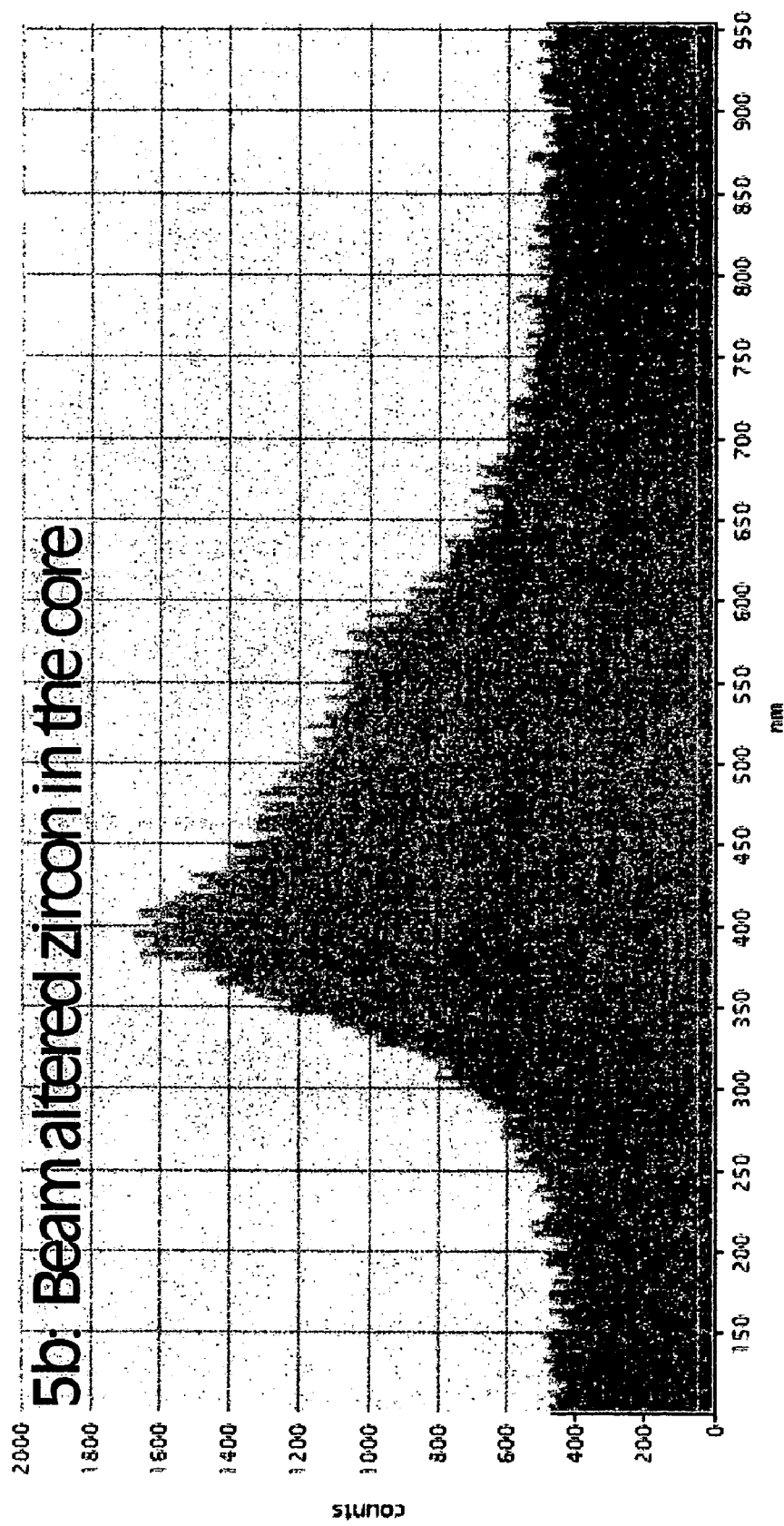
Figure 5C:
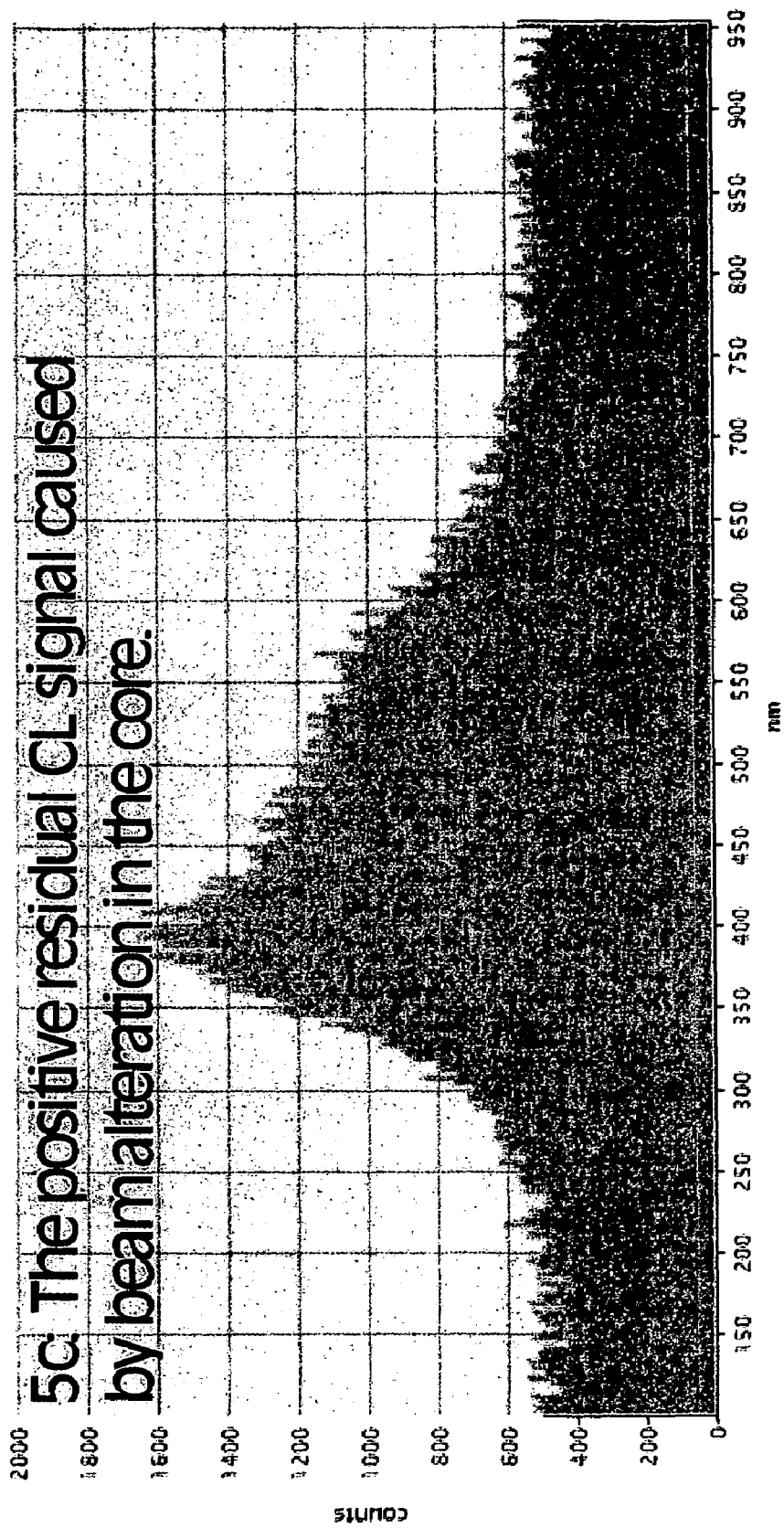

Pursuant to a feature of the present invention, the unique sequence of residual spectral patterns of FIGS. 3c, 4c, 5c are used to uniquely identify the zircon crystal sample. The identification information can further include the number and locations of the preselected altered spots and the intensity and duration of the beam(s) used to intentionally alter the spots. To that end, each spot may be altered by a beam of different intensity and duration than any other spot. The unique identification for each sample would be stored and maintained by an appointed agent.

When a particular sample is to be identified, the unique identification information for the sample is supplied by the agent, and a cathodoluminescence spectrum from each indicated altered spot location of the sample would be developed, for example, using an electron microscope with an attached cathodoluminescence detector. The developed spectral patterns would then be compared to the sequence of stored spectral patterns to verify the identity of the sample.

According to a feature of the present invention, the altered spots are each of microscopic dimension, so that they are not optically visible and cannot be easily identified absent the stored identification information. If an unauthorized person stripped an entire surface layer of the sample, to remove all of the preselected altered spots, the intentional alteration scheme can be repeated. In a homogeneous crystalline structure, the results of the spectrum alteration experienced the first time, will repeat upon the repeat of the procedure. The new sequence of spectral patterns would then be compared to the stored sequence to verify identity.

In the preceding specification, the invention has been described with reference to specific exemplary embodiments and examples thereof. It will, however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A method for marking a sample of a doped crystalline material, comprising the steps of:
    causing a controlled alteration to the crystalline material at a preselected spot on the sample of the crystalline material, sufficient to cause a change in a cathodoluminescence spectrum of the crystalline material at the preselected spot; and
    utilizing the changed cathodoluminescence spectrum to mark the crystalline material.

2. The method of claim 1, wherein the crystalline material comprises zircon.

3. The method of claim 1 wherein the step of causing a controlled alteration to the crystalline material at a preselected spot on the sample of the crystalline material, sufficient to cause a change in a cathodoluminescence spectrum of the crystalline material at the preselected spot is carried out at a microscopic level.

4. The method of claim 3 wherein the step of causing a controlled alteration to the crystalline material at a preselected spot on the sample of the crystalline material, sufficient to cause a change in a cathodoluminescence spectrum of the crystalline material at the preselected spot, at a microscopic level, is carried out using an electron source.

5. The method of claim 1 wherein the step of utilizing the changed cathodoluminescence spectrum to mark the crystalline material is carried out by storing the changed cathodoluminescence spectrum for the sample, detecting and developing spectral information at the preselected spot from a sample to be identified, and comparing the detected and developed spectral information to the stored changed cathodoluminescence spectrum.

6. The method of claim 1 wherein the doped crystalline material is doped by artificially introduced doping.

7. A method for marking and identifying a sample of a doped crystalline material, comprising the steps of:
    causing controlled alteration to the crystalline material at each of a sequence of preselected spots on the sample of the crystalline material, sufficient to cause a change in a cathodoluminescence spectrum of the crystalline material at each of the preselected spots; and
    storing information relating to the changed cathodoluminescence spectra at the sequence of the preselected spots.

8. The method of claim 7 comprising the further step of utilizing the stored information to identify the sample.

9. The method of claim 7 wherein the doped crystalline material is doped by artificially introduced doping.

10. The method of claim 7, wherein the stored information comprises information on locations of the sequence of preselected spots on the sample, information on the cause of the change of cathodoluminescence spectra and information on the changed cathodoluminescence spectra.

11. The method of claim 10 wherein information on the changed cathodoluminescence spectra comprises a representation of a residual of unaltered and altered spectra, at each one of the sequence of preselected spots.

12. The method of claim 7, wherein the crystalline material comprises zircon.

* * * * *